United States Patent [19]

Neppl et al.

[11] Patent Number: 5,034,338

[45] Date of Patent: Jul. 23, 1991

[54] CIRCUIT CONTAINING INTEGRATED BIPOLAR AND COMPLEMENTARY MOS TRANSISTORS ON A COMMON SUBSTRATE

[75] Inventors: Franz Neppl, Munich; Josef Winnerl, Landshut, both of Fed. Rep. of Germany

[73] Assignee: Siemens Aktiengesellschaft, Munich, Fed. Rep. of Germany

[21] Appl. No.: 379,108

[22] Filed: Jul. 13, 1989

Related U.S. Application Data

[60] Division of Ser. No. 323,218, Mar. 15, 1989, Pat. No. 4,884,117, which is a continuation of Ser. No. 60,914, Jun. 12, 1987, abandoned.

[30] Foreign Application Priority Data

Aug. 13, 1986 [DE] Fed. Rep. of Germany ....... 3627509

[51] Int. Cl.$^5$ .................. H01L 21/285; H01L 21/74; H01L 21/76; H01L 21/331
[52] U.S. Cl. ........................................ 437/33; 437/59; 437/78; 437/203
[58] Field of Search ........................ 437/31, 32, 33, 56, 437/57, 59, 186, 203, 78, 79; 148/DIG. 9

[56] References Cited

U.S. PATENT DOCUMENTS

| | | | |
|---|---|---|---|
| 3,913,124 | 10/1975 | Roberson | 357/40 |
| 4,454,647 | 6/1984 | Joy et al. | 357/50 |
| 4,571,817 | 2/1986 | Birritella et al. | 357/34 |
| 4,604,790 | 8/1986 | Bonn | 357/42 |
| 4,746,963 | 5/1988 | Uchida et al. | 357/50 |
| 4,749,661 | 6/1988 | Bower | 437/33 |
| 4,808,548 | 2/1989 | Thomas et al. | 437/57 |
| 4,835,115 | 5/1989 | Eklund | 437/38 |
| 4,910,572 | 3/1990 | Kameyama | 437/203 |

FOREIGN PATENT DOCUMENTS

| | | |
|---|---|---|
| EP0057126 | 8/1982 | European Pat. Off. |
| EP0139266 | 5/1985 | European Pat. Off. |
| 0256315 | 2/1988 | European Pat. Off. |
| 63-47963 | 2/1988 | Japan |

OTHER PUBLICATIONS

"Physics of Semiconductor Devices", Second Edition, S. M. Sze, (1981), p. 32.
IBM Technical Disclosure Bulletin, vol. 25, No. 3B, Aug. 1982, pp. 1482-1484, Title: "Poly Filled Trench Isolation".
Electronics, vol. 42, (Mar. 17, 1969), pp. 185-186.

*Primary Examiner*—Olik Chaudhuri
*Attorney, Agent, or Firm*—Hill, Van Santen, Steadman & Simpson

[57] ABSTRACT

A circuit which contains integrated bipolar and complementary MOS transistors, including wells in the substrate for forming the MOS transistors, the wells also containing isolated bipolar transistors, the wells forming the collector of the bipolar transistor and being surrounded by trenches which are filled with doped polycrystalline silicon. The doped trench reduces the lateral out diffusion from the wells and thus serves to increase the packing density while serving as a collector contact region. The invention is employed in the manufacture of integrated semiconductor circuits having high switching speeds.

7 Claims, 1 Drawing Sheet

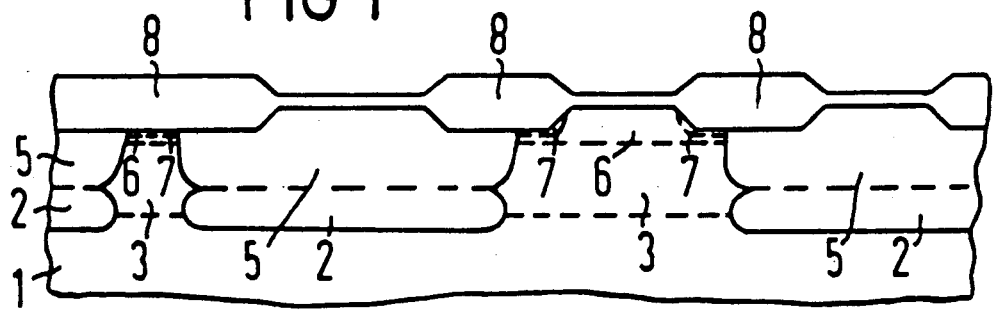
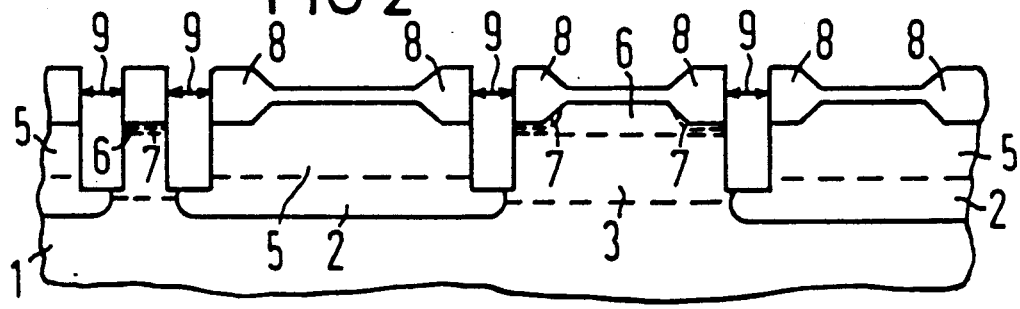
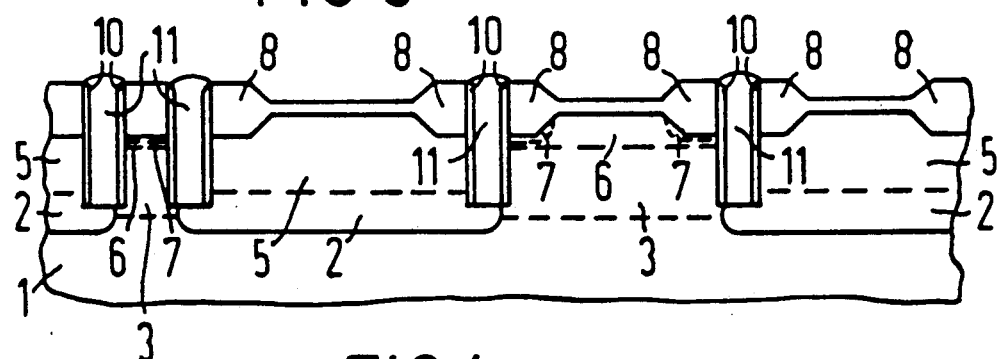
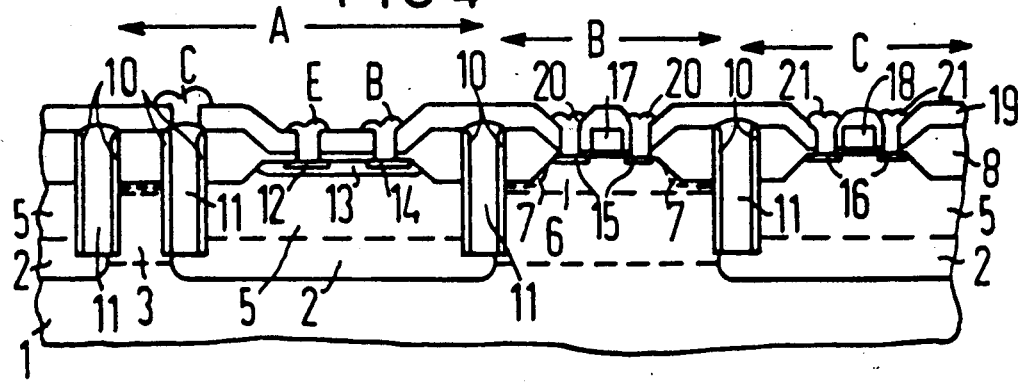

CIRCUIT CONTAINING INTEGRATED BIPOLAR AND COMPLEMENTARY MOS TRANSISTORS ON A COMMON SUBSTRATE

This is a division, of application Ser. No. 323,218, filed Mar. 15, 1989 now U.S. Pat. No. 4,884,117, which, in turn, is a continuation of U.S. Pat. Ser. No. 060,914, filed Jun. 12, 1987, now abandoned.

BACKGROUND OF THE INVENTION

1. Field of the Invention

The present invention is directed to a circuit containing integrated bipolar and complementary MOS transistors on a common substrate wherein suitably doped wells are provided in the substrate for accepting p-channel or n-channel transistors, the wells forming the collector of the bipolar transistor. The invention is also directed to a method for the manufacture of such integrated transistors.

2. Description of the Prior Art

When bipolar transistors and complementary MOS transistors are manufactured simultaneously on a chip, an n-well CMOS process is usually used, the emitter regions and base terminals of the bipolar transistors being implanted simultaneously with the source and drain regions of the MOS transistors, and subsequentially contacted with metal. Such a process is described, for example, in European Patent Application No. 86106486.3. The disclosure of that application is incorporated herein by reference. In that process, npn bipolar transistors are located in n-doped wells, the n-wells forming the collectors of the transistors and cover buried n+-doped zones which are connected in the bipolar transistor region by deeply extending collector terminals. The buried part and the collector terminal are generated before the well in this particular process. The well implantation is self-adjusting relative to the implantation of the deep collector terminal which is annularly located with respect to the well. The resulting structure evidences a reduction of collector series resistance as well as an increase in latch-up hardness.

In bipolar technology comprising diffused collectors and in CMOS or BICMOS circuits, however, the packing density is limited by the spacing of neighboring collector or CMOS wells. The minimum spacing between neighboring wells is defined by the lateral out diffusion of wells, of potentially existing buried layers, and collector terminal implantations, as well as the extent to which the depletion zone of the well-substrate junctions extend into the substrate.

It is also possible to reduce the problem by elevating the substrate doping between the wells or on buried layers. Although this reduces the extent of the depletion zones in the substrate and can partly compensate the lateral out-diffusion, it necessarily leads to an increase in the collector-substrate capacitance.

SUMMARY OF THE INVENTION

The present invention provides a circuit containing integrated CMOS transistors and bipolar transistors on a single chip wherein the latch-up hardness is increased in addition to an increase in the packing density due to the suppression of lateral out diffusion from the well regions while retaining unaltered transistor properties. The invention is also concerned with methods for the manufacture of such a circuit which can be carried out in simple, mask-saving process steps.

In accordance with the present invention, there is provided an integrated circuit wherein the n-doped or p-doped wells which accept the p-channel or n-channel MOS transistors as well as the wells containing the npn or pnp bipolar transistors are surrounded by trenches in the substrate which are filled with polycrystalline silicon of the same dopant but higher conductivity than the corresponding wells the doped trench fillings forming the terminal regions for the collectors.

An insulating layer preferably composed of silicon dioxide is arranged between the trench sidewall and the polycrystalline, doped polysilicon fill.

In specific embodiments of the invention, the substrate may consist of a p-doped (100) oriented silicon substrate having a specific electrical resistance of about 20 ohm cm. As another alternative, the substrate may be a p-doped (100) oriented silicon substrate having a specific resistance of 0.02 ohm cm in a modified form of the process of the present invention.

The following advantages are obtained from the improvements of the present invention and a typical process sequence therefore.

1. In CMOS or BICMOS circuits, the latch-up hardness is increased with unaltered transistor properties due to the presence of the etched trenches filled with polycrystalline silicon since the lateral parts of the parasitic bipolar transistors are considerably reduced, particularly when using separating oxide layers at the sidewalls of the trenches.

2. Using a separating oxide layer at the collector terminals, the collector-substrate capacitance is reduced in comparison to a mere junction capacitance or a higher substrate doping and thus a lower spacing between adjacent wells is possible without increasing the capacitance.

3. The use of doped polysilicon as a collector terminal eliminates a deep collector contact implantation and the associated diffusion step.

4. As the result of the faster diffusion of the dopants in the polycrystalline silicon in comparison to the neighboring, mono-crystalline silicon, the lateral out diffusion of the collector terminal into the mono-crystalline silicon is reduced in comparison to a traditional collector terminal implantation.

5. The lateral out diffusion of the collector terminal is avoided when using separating oxide layer.

BRIEF DESCRIPTION OF THE DRAWINGS

The process for the simultaneous manufacture of bipolar and complementary MOS transistors on a common substrate will be set forth in greater detail with reference to the embodiments shown in FIGS. 1 through 4. The method steps are shown combined in sections in the Figures, and identical reference characters are used for identical parts. The process shown in FIGS. 1 through 4 pertains to an n-well bipolar CMOS process; it can, however, be also converted into a p-well process.

DESCRIPTION OF THE PREFERRED EMBODIMENTS

In a traditional bipolar CMOS process, the well regions and active regions such as buried collector and collector contact regions, channel implantations, field implantations and field oxide regions are defined by the following method steps.

There is provided a p-doped substrate 1 (100) oriented, specific electrical resistance of 20 ohm cm in which there are provided buried, n+ doped zones 2 by implantation of n-doping ions such as antimony or arsenic, utilizing conventional photoresist masking of the remaining regions.

There is then applied a surface wide layer of a p-doped epitaxial layer 3 having an electrical resistivity of 20 ohm cm and a layer thickness of about 3 microns. An insulating double layer of $SiO_2$ and silicon nitride is then generated by deposition from the vapor phase (not shown in FIG. 1). An n-well 5 is generated in the substrate 1 by implantation of phosphorus ions after stripping the silicon nitride structures over the n-well regions, utilizing a conventional photoresist technique. There is then carried out an oxidation for masking the n-well regions 5 and simultaneous drive-in of the n-well 5 for a depth of about 3 microns. This is followed by a deep implantation of boron ions for manufacturing a surface distal region 6 of the channel zone of the n-channel transistors (B) as identified in FIG. 4. This is followed by the application of a double layer composed of a silicon oxide and silicon nitride and corresponding structuring of the silicon nitride layer (no longer visible in FIG. 1) for the succeeding local oxidation (LOCOS process). A boron ion implantation for doping the field regions of the n-channel transistor B is then carried out using photoresist masking of the remaining regions of the structure, thus producing p-doped regions 7. The conventional LOCOS process is then carried out for separating the active transistor regions, A, B, C and generating the field oxide regions 8 in a layer thickness of about 850 nm. Finally, the silicon nitride structure serving as an oxidation mask is stripped off.

Greater details regarding the carrying out of the individual process steps can be derived from the aforementioned European Patent Application No. 86106483.3, particularly the description relating to FIGS. 1 through 8 except that the reference shows deeply extending collector terminals whose generation is not required in the process of the present invention.

In FIG. 2, there is shown the critical step of etching trenches 9 into the edge region of the wells 5 by means of dry etching processes. A corresponding photomask is applied to the arrangement shown in FIG. 1, and an $SiO_2$ etching for removing of the field oxide regions 8 is first carried out with trifluoromethane and oxygen in the region of the photoresist layer (not shown) which has been exposed. A silicon etching for generating etched trenches 9 is then carried out using boron trichloride and chlorine gas. The trench depth is about 2 to 3 microns, i.e., it extends into the regions of the epitaxial layer 3.

After the trench etching to produce trenches 9, an intermediate oxide layer is deposited from the vapor phase and is again removed by anistropic etching in trifluouromethane and oxygen to such a degree that a $SiO_2$ layer 10 of about 100 nm thickness remains at the sidewall of the trenches 9, as shown in FIG. 3. The filling of the trenches 9, 10 with n+-doped polycrystalline silicon then occurs by deposition of silicon from the vapor phase. The deposition may occur jointly with the implantation of a dopant composed or arsenic or phosphorus or it may occur by subsequent ion implantation. Next, the doped polysilicon layer is structured according to usual techniques of photoresist masking.

FIG. 4 shows the finished arrangement provided with the emitter, base and collector regions and gate electrodes and their connections. These method steps are performed in a known way, for example, as recited in the aforementioned European Patent Application No. 26106483.3, particularly in the description of FIGS. 9 through 14.

Referring to FIG. 4, reference 12 has been applied to the emitter zone (n+) of the npn bipolar transistor A while the base zone (p) of this transistor has been labeled 13. The base terminal zone (p+) of the bipolar transistor A is identified at reference 14.

In FIG. 4, reference 15 denotes the source/drain zone of the n-channel MOS transistor B and 16 denotes the source/drain zone of the p-channel MOS transistor C. The gate electrode of the n-channel MOS transistor B is identified at 17, while 18 identifies the gate electrode of the p-channel MOS transistor C. The $SiO_2$ intermediate insulating layer is identified at reference 19.

C, E, and B are the collector, emitter and base terminals, respectively, composed of aluminum for the bipolar transistor A. Reference 20 and 21 define the source/drain terminals of the n-channel or the p-channel transistors which are likewise composed of aluminum.

In a modified form of the invention, it also possible to omit the oxide intermediate layer 10 between the n+ doped polysilicon fill 11 and the sidewall 9 of the trench. Although the process becomes simpler, there is a certain lateral diffusion of the collector terminal which must be tolerated.

It should be evident that various modifications can be made to the described embodiments without departing from the scope of the present invention.

We claim as our invention:

1. In a method of manufacturing bipolar and complementary MOS transistors on a common doped substrate, the steps comprising:
   generating wells in said substrate of a conductivity type opposite to that of said substrate,
   etching trenches in said wells, and
   filling the trenches with doped polysilicon having said conductivity type opposite to that of said substrate.

2. A method according to claim 1 which includes the steps of:
   applying an intermediate oxide to said trenches before filling the same, and
   etching said oxide back to leave said oxide only on the sidewalls of said trenches.

3. A method for the manufacture of bipolar and complementary MOS transistors on a common doped substrate which comprises:
   providing buried zones in said substrate of a conductivity type opposite to that of said substrate,
   applying an epitaxial layer over said substrate of the same conductivity type as said substrate,
   generating wells in said substrate of a conductivity type opposite to that of said substrate,
   etching trenches in said wells down to the depth of said epitaxial layer,
   filling the trenches with doped polysilicon having a conductivity type opposite to that of said substrate, and
   generating bipolar and MOS transistors between said trenches.

4. A method according to claim 4 which includes the step of applying an intermediate oxide layer to said trenches before filling the same, and etching away said intermediate oxide layer except for the sidewalls of said trenches.

5. A method for the manufacture of bipolar and complementary MOS transistors on a common silicon substrate which comprises:

forming buried n+ doped zones in a p-doped semiconductor substrate, applying a p-doped epitaxial layer over the entire surface, generating n-wells in said substrate by implanting n-doping ions therein, driving in the implanted n-doping ions while simultaneously oxidizing the surface of the n-well regions, implanting boron ions for the manufacture of a surface distal region of the channel zone of the n-channel MOS transistors, implanting boron ions for doping the field oxide regions of the n-channel MOS transistors, forming field oxide regions to separate the various active regions in said substrate, generating etched trenches in the lateral edge regions of said wells down to the depth of said p-doped epitaxial layer, depositing an intermediate oxide in said trenches, selectively etching away said intermediate oxide to leave an oxide layer on the sidewalls of said trenches, depositing polycrystalline silicon in said trenches, doping the polycrystalline silicon with n+ doping ions, forming the base zone of the bipolar transistors by boron ion implantation, oxidizing the exposed surface to generate a gate oxide, implanting boron ions for doping the channel regions of the MOS transistors, depositing a gate material to form gate electrodes in the MOS transistors, depositing a silicon oxide intermediate oxide layer on the surface, simultaneously forming the source/drain regions of the n-channel MOS transistors, the emitter and the n collector contact of the bipolar transistors by implantation of n-doping ions, simultaneously forming the source/drain regions of the p-channel MOS transistors and the p+ base contact of the bipolar transistors by boron ion implantation, and applying terminal electrodes to the transistor elements.

6. A method according claim 5 in which said substrate is a p-doped (100)-oriented silicon substrate having a specific resistance of about 20 ohm cm.

7. A method according to claim 5 wherein said substrate is a p-doped (100)-oriented silicon substrate having a specific electrical resistance of 0.02 ohm cm.

* * * * *